(12) United States Patent
Choi

(10) Patent No.: US 7,408,823 B2
(45) Date of Patent: Aug. 5, 2008

(54) SEMICONDUCTOR DEVICE AND METHOD THEREOF

(75) Inventor: Seung-Jae Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 261 days.

(21) Appl. No.: 11/342,849

(22) Filed: Jan. 31, 2006

(65) Prior Publication Data

US 2007/0058449 A1 Mar. 15, 2007

(30) Foreign Application Priority Data

Sep. 15, 2005 (KR) ...................... 10-2005-0086252

(51) Int. Cl.
*G11C 7/00* (2006.01)

(52) U.S. Cl. ................ 365/195; 365/225.7; 365/189.17

(58) Field of Classification Search ................. 365/195, 365/225.7, 189.17

See application file for complete search history.

(56) References Cited

U.S. PATENT DOCUMENTS 7,136,303 B2 * 11/2006 Smith et al. ............ 365/185.08
7,236,043 B2 * 6/2007 Wich et al. .................. 327/525
2007/0041246 A1 * 2/2007 Smith et al. ............ 365/185.08

FOREIGN PATENT DOCUMENTS

| JP | 6350041 | 12/1994 |
| JP | 7078468 | 3/1995 |
| JP | 2002076126 | 3/2002 |
| KR | 10-1996-0011541 | 8/1996 |
| KR | 1999-025045 | 4/1999 |

* cited by examiner

*Primary Examiner*—Tuan T Nguyen
(74) *Attorney, Agent, or Firm*—Harness, Dickey & Pierce, P.L.C.

(57) ABSTRACT

A semiconductor device and method thereof. The semiconductor device may include a protection unit receiving an input signal and outputting a switching control signal based on the received input signal, the received input signal indicating an operating mode of a controller and a switching device receiving the switching control signal, the switching control signal setting an operating status of the switching device, the operating status of the switching device controlling a connection between the controller and an operating device (e.g., an e-fuse). In an example, the switching device may be controlled such that the operating device may be protected from voltage irregularies output by the controller.

20 Claims, 4 Drawing Sheets

SEMICONDUCTOR DEVICE AND METHOD THEREOF

PRIORITY STATEMENT

This non-provisional application claims priority under 35 U.S.C. § 119 to Korean Patent Application No. 10-2005-0086252 filed on Sep. 15, 2005 in the Korean Intellectual Proterty Office (KIPO), the entire contents of which are incorporated herein by reference in their entirety.

BACKGROUND OF THE INVENTION

1. Field of the Invention

Example embodiments of the present invention are directed generally to a semiconductor device and method thereof, and more particularly to a semiconductor device and method of protecting the semiconductor device.

2. Description of the Related Art

A conventional electronic fuse ("e-fuse") may include first and second terminals, the first and second terminals collectively having a resistance with a magnitude which may approximate a few hundred ohms. The resistance at the first and second terminals may increase to several megaohms if a voltage is applied at the first and second terminals, thereby causing the e-fuse to acquire insulating characteristics.

An e-fuse may thereby be characterized as having a first state and a second state. The first state may correspond to a lower resistance or conductive state and the second state may correspond to a higher resistance or insulative state. In the first state, the e-fuse may have a resistance with an approximate magnitude of a few hundred ohms (e.g., if a voltage is not applied to the e-fuse). In the second state, the e-fuse may have a resistance with an approximate magnitude of several megaohms (e.g., if a voltage is applied to the e-fuse). Since the resistance of the e-fuse may be responsive to an applied voltage, the e-fuse may be employed in a semiconductor memory device, such as a read-only memory (ROM).

An e-fuse state may be set in accordance with control signals applied by a control logic. However, if a voltage applied to the e-fuse becomes unstable (e.g., an voltage spike output by control logic), the e-fuse may be damaged.

SUMMARY OF THE INVENTION

An example embodiment of the present invention is directed to a semiconductor device, including a protection unit receiving an input signal and outputting a switching control signal based on the received input signal, the received input signal indicating an operating mode of a controller and a switching device receiving the switching control signal, the switching control signal setting an operating status of the switching device, the operating status of the switching device controlling a connection between the controller and an operating device.

Another example embodiment of the present invention is directed to a method controlling a connection between a controller and an operating device, including receiving an input signal indicating an operating mode of the controller, outputting a switching control signal based on the received input signal and setting an operating status of a switching device based on the switching control signal, the operating status of the switching device controlling a connection between the controller and the operating device.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
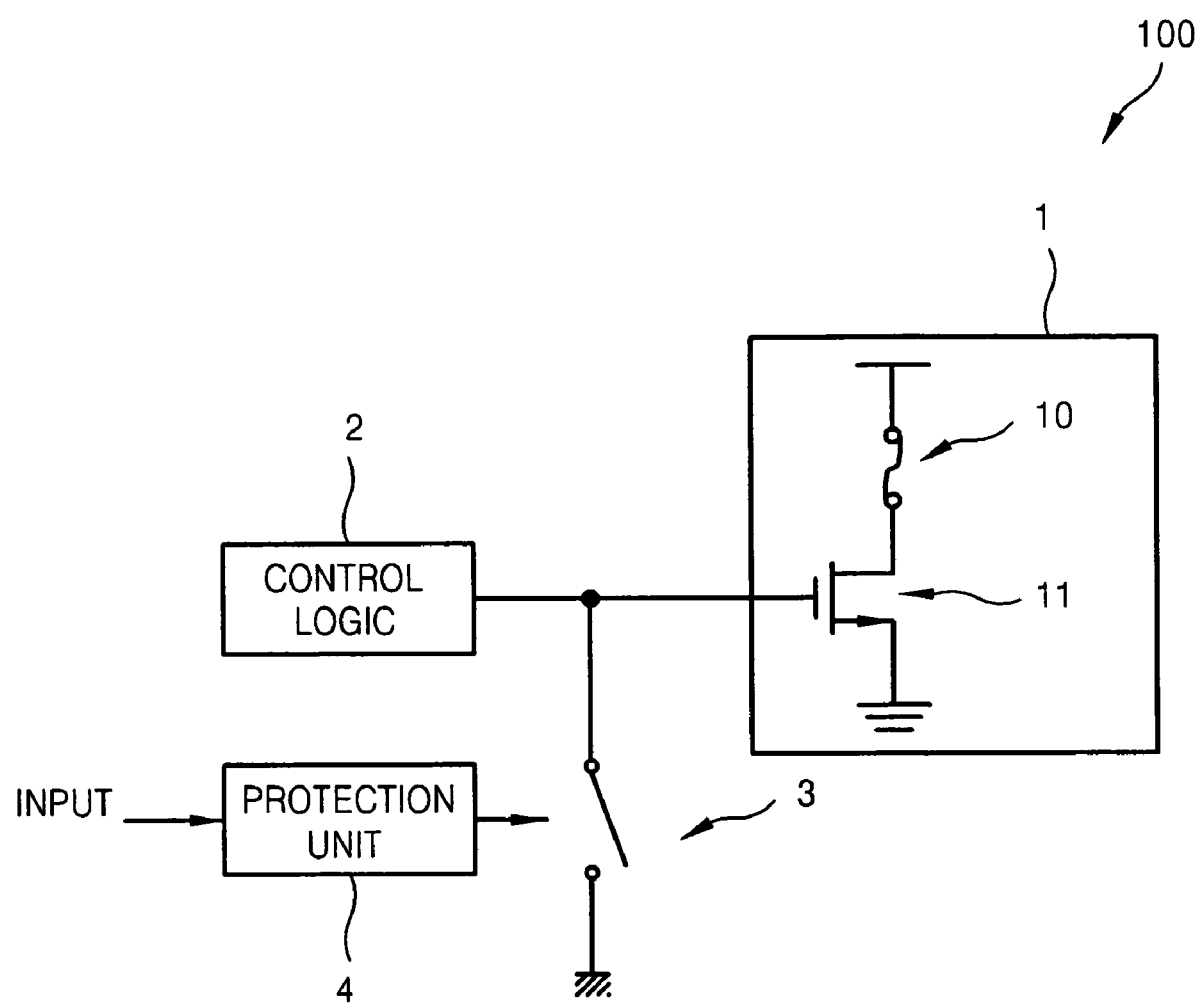
FIG. 1 is a block diagram illustrating a semiconductor device according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device 100 according to an example embodiment of the present invention.

In the example embodiment of FIG. 1, the semiconductor device 100 may include an e-fuse unit 1, control logic 2, a switch 3, and a protection unit 4. The e-fuse unit 1 may include an e-fuse 10 having a first terminal connected to a power supply and a second terminal connected to an e-fuse program transistor 11. The e-fuse program transistor 11 may have a first terminal connected to the e-fuse 10 and a second terminal connected to a ground voltage. In an example, the e-fuse program transistor 11 may be embodied as an NMOS transistor, as illustrated in the example embodiment of FIG. 1. However, it is understood that other example embodiments of the pressent invention may embody the e-fuse program transistor 11 as a PMOS transistor. Thus, in an example where the e-fuse program transistor 11 may be embodied as a PMOS transistor, the semiconductor device of FIG. 1 may be modified such that a switching signal input to the e-fuse program transistor 11 and an output signal of the control logic 2 may have opposite logic levels as compared to a respective implementation with the NMOS transistor. In another example embodiment of the present invention, the e-fuse program transistor 11 may be embodied as a transmission gate.

In the example embodiment of FIG. 1, the e-fuse unit 1 may further include a read-out circuit (not shown) connected to the second terminal of the e-fuse 10. The read-out circuit may read a state of the e-fuse 10. For example, the read-out circuit may interpret the e-fuse 10 as corresponding to a first logic level (e.g., a higher logic level or logic "1") or a second logic level (e.g., a lower logic level or logic "0"), for example based on a resistance of the e-fuse 10. The e-fuse unit 1 may thereby be used as a memory in a semiconductor memory device.

In the example embodiment of FIG. 1, the control logic 2 may output a control signal from an output terminal in a program mode to transition a state of the e-fuse 10. The switch 3 may include a first terminal connected to the output terminal of the control logic 2, a second terminal connected to the output terminal of the control logic 2 and a third terminal connected to the ground voltage. The protection unit 4 may protect the e-fuse program transistor 11 by controlling an operating state of the switch 3. The protection unit 4 may receive an input value INPUT and, based on a logic level of the input value INPUT, may output a signal which determines whether the switch 3 is turned on or turned off.

In the example embodiment of FIG. 1, if the switch 3 is turned-on, the e-fuse program transistor 11 may be turned-off and the e-fuse 10 may thereby not be responsive to the control logic 2. Alternatively, if the switch 3 is turned-off, a status the e-fuse program transistor 11 may be determined in accordance with control signals received from the control logic 2.

In the example embodiment of FIG. 1, if the control logic 2 is being used (e.g., by a user) to program the e-fuse 10, the switch 3 may be turned-off by inputting the inut value INPUT to the protection unit 4 at a given logic level (e.g., the first logic level, the second logic level, etc.).

In the example embodiment of FIG. 1, the switch 3 may be turned on in response to a triggering criteria. For example, the triggering criteria may include one or more of a condition where an initial voltage (e.g., of the e-fuse 10, of the control logic 2, an external voltage, etc.) is unstable, a regulator output voltage is unstable, control signals output from the control logic 2 are unknown and/or floating, the control logic 2 is not in a programming mode (e.g., for programming the e-fuse 10), and/or other application specific triggering critieria. It will be appreciated that the e-fuse 10 may be isolated or protected (e.g., from a voltage or current spike) while the switch 3 is turned on. The e-fuse 10 may thereby be selectively isolated or protected from the control logic 2.

Figure 2:
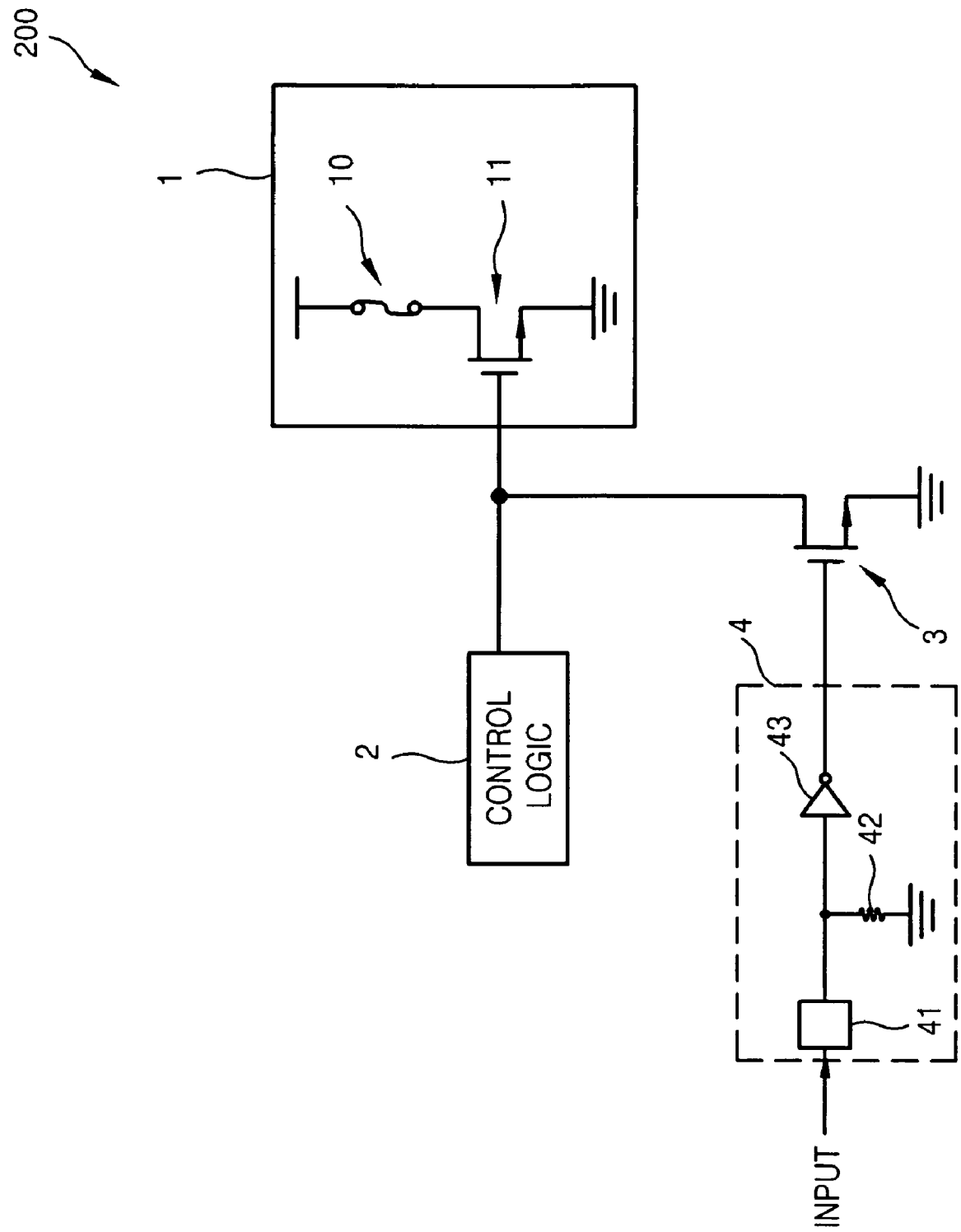
FIG. 2 is a block diagram illustrating another semiconductor device according to another example embodiment of the present invention.

FIG. 2 is a block diagram illustrating a semiconductor device 200 according to another example embodiment of the present invention. The semiconductor device 200 of FIG. 2 may be similar to the above-described semiconductor 100 of FIG. 1 with the exception of further detail being illustrated with respect to the protection unit 4 and the switch 3. As such, structural and functional descriptions of elements other than the protection unit 4 and the switch 3 have been omitted from the description of the example embodiment of FIG. 2 for the sake of brevity.

In the example embodiment of FIG. 2, the protection part 4 may include a pad 41, a pull-down resistor 42 and an inverter 43. If the control logic 2 is not operating in a programming mode, the input signal INPUT may be received by the pad 41 at the second logic level (e.g., a lower logic level or logic "0"). The pull-down resistor 42 and the inverter 43 may convert the received input signal INPUT from the second logic level to the first logic level and may output the converted signal to the switch 3. The switch 3 may turn on in response to receipt of the converted signal and the e-fuse transistor 11 may thereby be turned off (e.g., may become isolated or protected from the control logic 2). Accordingly, if the control logic 2 is not operating in the programming mode, the e-fuse 10 may not be affected by the control logic 2. Thus, in an example, if errors or voltage spikes or other irregulatories occur on a path connected to the control logic 2, the e-fuse 10 may continue to operate normally.

the example embodiment of FIG. 2, if the control logic 2 is operating in a programming mode, the input signal INPUT may be received by the pad 41 at the first logic level (e.g., a higher logic level or logic "1"). The pull-down resistor 42 and the inverter 43 may convert the received input signal INPUT from the first logic level to the second logic level and output the converted signal to the switch 3. The switch 3 may turn off in response to receipt of the converted signal and the e-fuse transistor 11 may thereby be based on received control signals output by the control logic 2. Accordingly, if the control logic 2 is operating in the programming mode, the e-fuse 10 may be programmed by the control logic 2.

Figure 3:
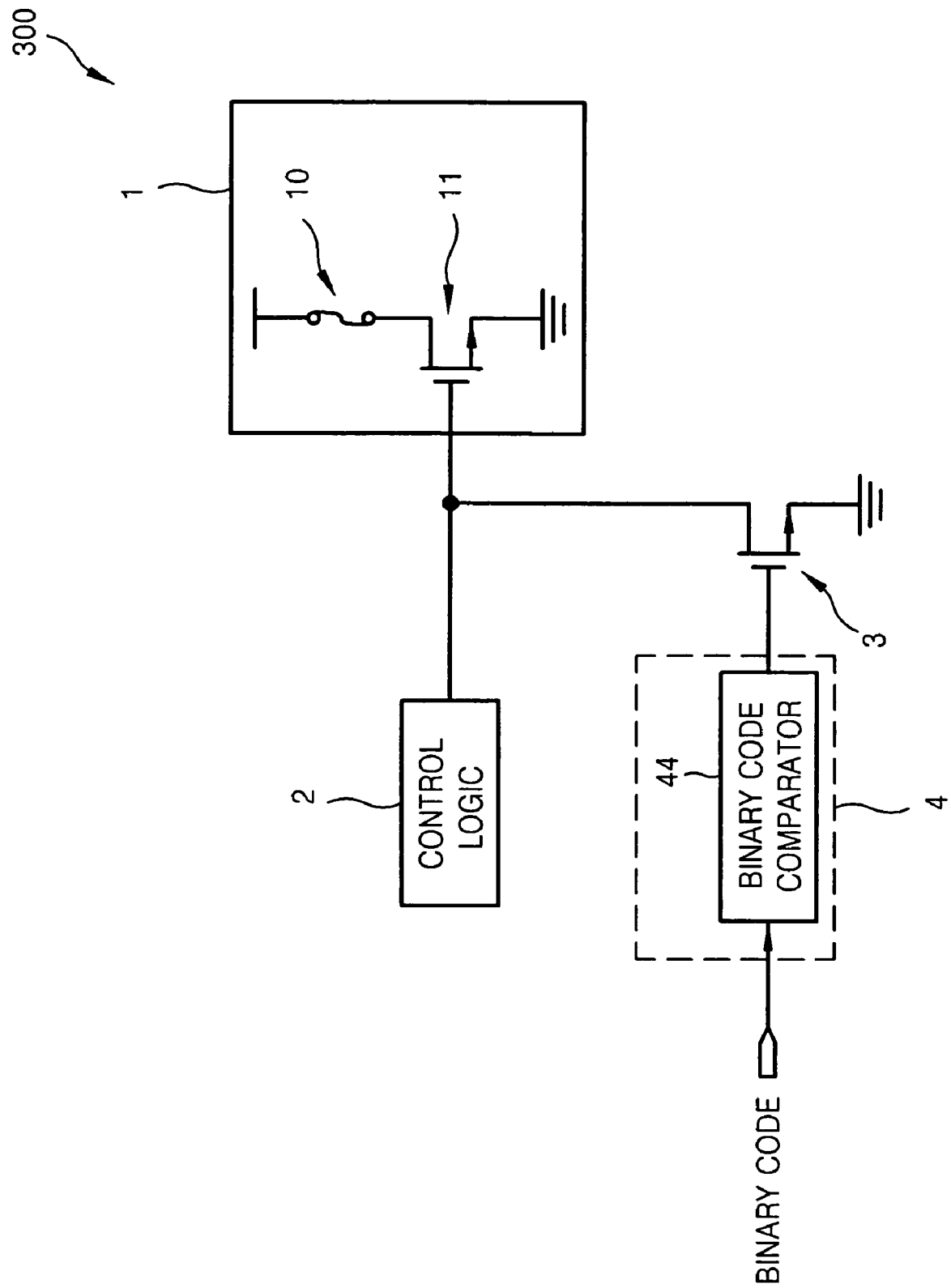
FIG. 3 is a block diagram illustrating another semiconductor device according to another example embodiment of the present invention.

FIG. 3 is a block diagram illustrating a semiconductor device 300 according to another example embodiment of the present invention. The semiconductor device 300 of FIG. 3 may be similar to the above-described semiconductor 100 of FIG. 1 with the exception of further detail being illustrated with respect to the protection unit 4 and the switch 3. As such, structural and functional descriptions of elements other than the protection unit 4 and the switch 3 have been omitted from the description of the example embodiment of FIG. 3 for the sake of brevity. The protection unit 4 of FIG. 3 may further be configured differently than the protection unit 4 of FIG. 2.

the example embodiment of FIG. 3, the protection unit 4 may include a binary code comparator 44. The binary code comparator 44 may include a plurality of logic arithmatic means (e.g., for analyzing and/or processing received binary code patterns).

In the example embodiment of FIG. 3, when the control logic 2 transitions to a programing mode, the protection unit 4 may receive a first binary code sequence. The protection unit 4 may interpret the first binary code sequence as indicating that the control logic 2 intends to program the e-fuse 10. The protection unit 4 may output a signal at the second logic level (e.g., a lower logic level or logic "0") after the binary code comparator 44 applies the plurality of logic arithmatic means to the received first binary code sequence. Accordingly, the switch 3 may be turned off and the e-fuse program transistor 11 may be turned on such that the e-fuse 10 may receive control signals sent by the control logic 2.

In the example embodiment of FIG. 3, when the control logic 2 transitions to an operating mode other than the programing mode, the protection unit 4 may receive a second binary code sequence. The protection unit 4 may interpret the second binary code sequence as indicating that the control logic 2 is not operating in the programming mode. The protection unit 4 may output a signal at the first logic level (e.g., a higher logic level or logic "0") after the binary code comparator 44 applies the plurality of logic arithmatic means to the received second binary code sequence. Accordingly, the switch 3 may be turned on and the e-fuse program transistor 11 may be turned off such that the e-fuse 10 may be isolated from the control logic 2.

In the example embodiment of FIG. 3, a user may configure the bit sequence for the first and second binary code sequences. Likewise, the user may also configure the plurality of logic arithmatic means employed by the binary code comparator 44. In an example, the example embodiment of FIG. 3 may be employed if the e-fuse unit 1 is included in a semiconductor chip where a number of available pads may be limited.

Figure 4:
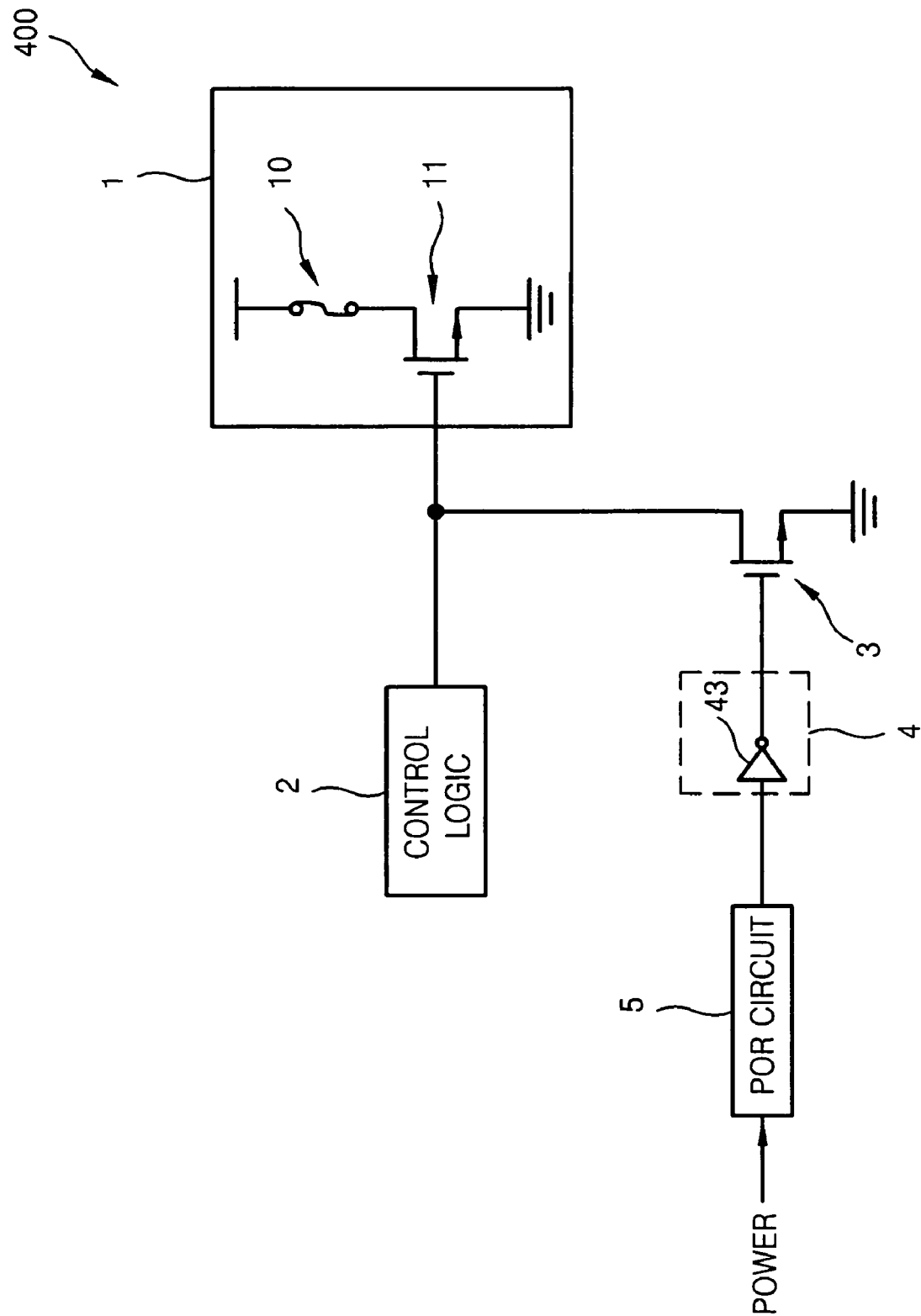
FIG. 4 is a block diagram illustrating another semiconductor device according to another example embodiment of the present invention.

FIG. 4 is a block diagram illustrating a semiconductor device 400 according to another example embodiment of the present invention. The semiconductor device 400 of FIG. 4 may be similar to the above-described semiconductor 100 of FIG. 1 with the exception of further detail being illustrated with respect to the protection unit 4 and the switch 3. As such, structural and functional descriptions of above-described elements other than the protection unit 4 and the switch 3 have been omitted from the description of the example embodiment of FIG. 4 for the sake of brevity.

In the example embodiment of FIG. 4, the semiconductor device 400 may further include an analog Power On Reset (POR) circuit 5. The POR circuit 5 may be connected to an external supply voltage and may serve to stabilize an internal voltage of the semiconductor device 400. The POR circuit 5 may output the second logic level (e.g., a lower logic level or logic "0") if the external supply voltage is unstable (e.g., during initial operation) and may output the first logic level (e.g., a higher logic level or logic "1") if the external supply voltage is stable.

In the example embodiment of FIG. 5, the protection unit 4 may include an inverter 46. The inverter 46 may invert a POR output signal received from the POR circuit 5. Accordingly, if the POR output signal is at the second logic level, the inverter 46 may turn on the switch 3 by outputting the first logic level. Thus, if the external supply voltage is unstable, the e-fuse 10 may be isolated from the control logic 2, thereby protecting the e-fuse 10. If the external supply voltage achieves stability and the POR output signal set to the first logic level, the inverter 46 may output the second logic level and the switch 3 may be turned off. Accordingly, the e-fuse 10 may be programmed by the control logic 2.

In another example embodiment of the present invention, a connection path between a controller (e.g., control logic 2) and an operating device (e.g., e-fuse unit 1) may be shorted during periods where the controller is not in a programming mode (e.g., not actively programming the e-fuse unit). Thereby, the e-fuse unit may be protected from voltage spikes and/or other irregularies output from the controller during periods where control signals from the controller need not be received.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, while above-described example embodiments of the present invention may be illustrated as employing NMOS transistors, it is understood that other example embodiments of the present inventions may employ PMOS transistors, transmission gates and/or other logic structures.

Further, while above-described example embodiments of the present invention are directed to an e-fuse, it is understood that other example embodiments of the present invention may be directed to isolating a controller or other output device from any operating device (e.g., other than an e-fuse).

Such variations are not to be regarded as a departure from the spirit and scope of example embodiments of the present invention, and all such modifications as would be obvious to one skilled in the art are intended to be included within the scope of the following claims.

What is claimed is:

1. A semiconductor device, comprising:
a protection unit receiving an input signal and outputting a switching control signal based on the received input signal, the received input signal indicating an operating mode of a controller; and
a switching device receiving the switching control signal, the switching control signal setting an operating status of the switching device, the operating status of the switching device controlling a connection between the controller and an operating device.

2. The semiconductor device of claim 1, wherein the switching device includes a first terminal receiving the switching control signal, a second terminal connected to an output of the controller and a third terminal connected to a ground voltage.

3. The semiconductor device of claim 1, wherein the operating device is an e-fuse unit and the controller is control logic.

4. The semiconductor device of claim 3, wherein the e-fuse unit includes an e-fuse and an e-fuse program transistor.

5. The semiconductor device of claim 4, wherein the e-fuse program transistor includes a first terminal connected to the e-fuse and a second terminal connected to a ground voltage.

6. The semiconductor device of claim 4, wherein an operating status of the e-fuse program transistor is based on the operating status of the switching device.

7. The semiconductor device of claim 6, wherein the operating status of the e-fuse program transistor is determined based on control signals received from the controller if the operating status of the switching device is turned off.

8. The semiconductor device of claim 1, wherein the protection unit includes a pull-down resistor receiving the input signal and an inverter inverting an output of the pull-down resistor to output the switching control signal.

9. The semiconductor device of claim 1, wherein the protection unit includes a binary code comparator receiving a binary code sequence and outputting the switching control signal based on the binary code sequence.

10. The semiconductor device of claim 9, wherein the binary code comparator outputs the switching control signal at a first logic level if the binary code sequence is in a first arrangement and the binary code comparator outputs the switching control signal at a second logic level if the binary code sequence is in a second arrangement.

11. The semiconductor device of claim 1, further comprising:
a power on reset (POR) circuit receiving a power voltage and outputting a POR output signal in response to the power voltage.

12. The semiconductor device of claim 11, wherein the protection unit includes an inverter receiving the POR output signal and outputting an inverted version of the POR output signal as the switching control signal.

13. The semiconductor device of claim 1, wherein the operating mode is a programming mode.

14. A method controlling the connection between the controller and the operating device in the semiconductor device of claim 1.

15. A method controlling a connection between a controller and an operating device, comprising:
receiving an input signal indicating an operating mode of the controller;
outputting a switching control signal based on the received input signal; and
setting an operating status of a switching device based on the switching control signal, the operating status of the switching device controlling the connection between the controller and the operating device.

16. The method of claim 15, wherein the operating device is an e-fuse unit and the controller is control logic.

17. The method of claim 15, wherein the received input signal includes a number of bits arranged in a binary code sequence.

18. The method of claim 17, wherein the binary code sequence is processed to determine whether to set the switching control signal to a first logic level or a second logic level.

19. The method of claim 15, wherein the received input signal is an external power supply.

20. The method of claim 15, wherein the operating mode is a programming mode.

* * * * *